(12) United States Patent
Liu

(10) Patent No.: US 10,658,446 B2
(45) Date of Patent: May 19, 2020

(54) METHOD FOR MANUFACTURING OLED BACKPLANE COMPRISING ACTIVE LAYER FORMED OF FIRST, SECOND, AND THIRD OXIDE SEMICONDUCTOR LAYERS

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Fangmei Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 173 days.

(21) Appl. No.: 15/742,814

(22) PCT Filed: Nov. 29, 2017

(86) PCT No.: PCT/CN2017/113513
§ 371 (c)(1),
(2) Date: Jan. 8, 2018

(87) PCT Pub. No.: WO2019/080252
PCT Pub. Date: May 2, 2019

(65) Prior Publication Data
US 2019/0386083 A1  Dec. 19, 2019

(30) Foreign Application Priority Data

Oct. 24, 2017 (CN) .......................... 2017 1 1004263

(51) Int. Cl.
H01L 27/32 (2006.01)
H01L 51/52 (2006.01)
(Continued)

(52) U.S. Cl.
CPC ...... H01L 27/3262 (2013.01); H01L 27/3246 (2013.01); H01L 27/3272 (2013.01);
(Continued)

(58) Field of Classification Search
CPC .................... H01L 27/3262; H01L 29/78687
See application file for complete search history.

(56) References Cited

U.S. PATENT DOCUMENTS

2008/0246392 A1   10/2008  Kho et al.
2017/0263783 A1*   9/2017  Yamazaki ......... H01L 29/78648
2018/0151120 A1*   5/2018  Kim .................... G09G 3/3258

FOREIGN PATENT DOCUMENTS

CN        104022044        9/2014
CN        106298958        1/2017
(Continued)

*Primary Examiner* — Daniel Whalen
(74) *Attorney, Agent, or Firm* — Hemisphere Law, PLLC; Zhigang Ma

(57) ABSTRACT

A method for manufacturing an organic light-emitting diode (OLED) backplane is provided. The method includes sequentially depositing a first oxide semiconductor layer, a second oxide semiconductor layer and a third oxide semiconductor layer to obtain an active layer of a thin film transistor. The flow ratio of an argon gas and an oxygen gas introduced during the deposition of the first and third oxide semiconductor layers is greater than the flow ratio of the argon gas and the oxygen gas introduced during the deposition of the second oxide semiconductor layer. As a result, the oxygen content of the first and third oxide semiconductor layers is greater than the oxygen content of the second oxide semiconductor layer. Therefore, the conductivity of the active layer of the thin film transistor device is enhanced. The interface defects are reduced. The stability of the thin film transistor device is improved.

14 Claims, 8 Drawing Sheets

(51) Int. Cl.
    *H01L 51/56*     (2006.01)
    *H01L 21/02*     (2006.01)
    *H01L 21/383*     (2006.01)
    *H01L 21/443*     (2006.01)
    *H01L 21/4757*     (2006.01)
    *H01L 27/12*     (2006.01)
    *H01L 29/24*     (2006.01)
    *H01L 29/786*     (2006.01)

(52) U.S. Cl.
    CPC ...... H01L 51/5206 (2013.01); H01L 51/5221 (2013.01); H01L 51/56 (2013.01); H01L 21/0217 (2013.01); H01L 21/02164 (2013.01); H01L 21/02488 (2013.01); H01L 21/02565 (2013.01); H01L 21/02631 (2013.01); H01L 21/383 (2013.01); H01L 21/443 (2013.01); H01L 21/47573 (2013.01); H01L 27/127 (2013.01); H01L 27/1225 (2013.01); H01L 29/24 (2013.01); H01L 29/7869 (2013.01); H01L 29/78633 (2013.01); H01L 29/78696 (2013.01); H01L 2227/323 (2013.01)

(56) References Cited

FOREIGN PATENT DOCUMENTS

| | | |
|---|---|---|
| CN | 106876280 | 6/2017 |
| CN | 107104150 | 8/2017 |
| CN | 107123671 | 9/2017 |

\* cited by examiner

METHOD FOR MANUFACTURING OLED BACKPLANE COMPRISING ACTIVE LAYER FORMED OF FIRST, SECOND, AND THIRD OXIDE SEMICONDUCTOR LAYERS

RELATED APPLICATIONS

The present application is a National Phase of International Application Number PCT/CN20171113513, filed on Nov. 29, 2017, and claims the priority of China Application 201711004263.X, filed on Oct. 24, 2017, the entirety of which is incorporated by reference herein.

FIELD OF THE DISCLOSURE

The disclosure relates to a display technical field, and more particularly to a method for manufacturing an organic light-emitting diode (OLED) backplane.

BACKGROUND

Planar display devices are widely applied due to numerous advantages such as thin bodies, energy saving, radiation-free, etc. The current planar display devices mainly comprise liquid crystal display (LCD) devices and organic light-emitting diode (OLED) display devices.

OLED display devices have excellent properties including self-luminous, no backlight, high contrast, thin thickness, wide viewing angle, fast response, applicable for flexible panels, wide temperature range for use, simpler structure and process, etc. Accordingly, the OLED display devices are considered as the emerging application of the next generation of flat panel display technologies. An OLED display device generally includes a substrate, an anode disposed on the substrate, an organic light-emitting layer disposed on the anode, and a cathode disposed on the organic light-emitting layer. When it operates, the holes from the anode and the electrons from the cathode are emitted to the organic light-emitting layer. The electrons and holes are combined to generate excited electron-hole pairs. The excited electron-hole pairs are converted from the excited state to the ground state so as to achieve light-emitting.

According to driving modes, the OLED display device can be classified into two main types: a passive matrix OLED (PMOLED) type and an active matrix OLED (AMOLED) type. They are two categories of direct addressing and thin film transistor (TFT) matrix addressing. Among them, the AMOLED has pixels arranged in an array. It belongs to the active display type with high light-emitting efficiency and excellent performance.

Thin film transistors commonly used in the prior art include amorphous silicon (a-Si) thin film transistors, low temperature poly-silicon (LTPS) thin film transistors, and oxide semiconductor thin film transistors. The oxide semiconductor thin film transistors have higher electron mobility. Moreover, compared with the LTPS thin film transistors, the fabrication process of the oxide semiconductor thin film transistors is simpler and has higher compatibility with amorphous silicon thin film transistor processes. Therefore, the oxide semiconductor thin film transistors have been widely used.

In the oxide semiconductor thin film transistor, the oxygen content in its active layer (i.e., the oxide semiconductor layer) has a great influence on the device characteristics. Currently, the active layer in the oxide semiconductor thin film transistor is generally designed as a single film. The active layer with this kind of single film is formed through one deposition process. If the oxygen flow rate during the deposition process is larger, the oxygen content of the active layer will be too high. As a result, the conductivity becomes poor, and the mobility of the device is reduced. On the other hand, if the oxygen flow rate during the deposition process is smaller, the oxygen content in the active layer is too low, and there are more oxygen vacancies. As a result, the interface defects at the contact interface between the active layer and the buffer layer and the contact interface between the active layer and the gate insulating layer increase. The device stability becomes worse.

SUMMARY

The objective of the disclosure is to provide a method for manufacturing an OLED backplane. Therefore, the conductivity of the active layer of the thin film transistor device can be enhanced. The interface defects can be reduced. The stability of the thin film transistor device can be improved.

In order to achieve the above objective, the disclosure provides a method for manufacturing an OLED backplane, comprising the following steps:

Step S1: providing a base substrate, and forming a buffer layer on the base substrate.

Step S2: depositing a first oxide semiconductor layer on the buffer layer, and introducing an argon gas and an oxygen gas with a flow ratio of the argon gas to the oxygen gas being a first ratio during the deposition.

Step S3: depositing a second oxide semiconductor layer on the first oxide semiconductor layer, and introducing the argon gas and the oxygen gas with a flow ratio of the argon gas to the oxygen gas being a second ratio during the deposition.

Step S4: depositing a third oxide semiconductor layer on the second oxide semiconductor layer, and introducing the argon gas and the oxygen gas with a flow ratio of the argon gas to the oxygen gas being a third ratio during the deposition such that an active layer comprising the first oxide semiconductor layer, the second oxide semiconductor layer, and the third oxide semiconductor layer is obtained.

Step S5: forming, over the active layer, a gate insulating layer and a gate electrode on the gate insulating layer.

Step S6: covering the active layer, the gate electrode and the gate insulating layer with an interlayer insulating layer thereon.

Step S7: forming a source electrode and a drain electrode on the interlayer insulating layer.

The first ratio and the third ratio are both greater than the second ratio.

The first ratio and the third ratio are both in a range from 2:1 to 4:1. The second ratio is in a range from 10:1 to 20:1.

The thickness of the first oxide semiconductor layer and the third oxide semiconductor layer is in a range from 50 Å to 100 Å. The thickness of the second oxide semiconductor layer is in a range from 200 Å to 800 Å.

The first oxide semiconductor layer, the second oxide semiconductor layer and the third oxide semiconductor layer are both an indium gallium zinc oxide (IGZO) material. The buffer layer and the gate insulating layer are both one of or a combination of silicon oxide and silicon nitride.

The step S1 further comprises: forming a light shielding layer between the base substrate and the buffer layer. The light shielding layer shields the active layer.

The step S5 specifically comprises:

depositing a gate insulating film on the active layer and the buffer layer, and depositing a gate metal film on the gate insulating film;

patterning the gate metal film by a mask process to form the gate electrode;

etching the gate insulating film with the gate electrode as a mask to form the gate insulating layer.

In the step S5, the gate electrode and the gate insulating layer cover the center of the active layer and expose two ends of the active layer.

Between the step S5 and the step S6, the method further comprises the following step: performing a plasma treatment on the active layer such that the resistance of the two ends of the active layer is reduced to form an N+ conductor layer.

The step S6 further comprises: patterning the interlayer insulating layer to form a first via hole and a second via hole respectively exposing the two ends of the active layer. In the step S7, the source electrode and the drain electrode are respectively in contact with the two ends of the active layer through the first via hole and the second via hole.

The method for manufacturing an OLED backplane further comprises:

Step S8: depositing a passivation layer on the interlayer insulating layer, the source electrode and the drain electrode, and patterning the passivation layer to form a third via hole exposing the drain electrode.

Step S9: forming a first electrode on the passivation layer. The first electrode is in contact with the drain electrode through the third via hole.

Step S10: forming a pixel defining layer on the first electrode and the passivation layer, and patterning the pixel defining layer to form a pixel defining recess exposing the first electrode.

Step S11: forming an organic light-emitting layer in the pixel defining recess, and forming a second electrode on the pixel defining layer and the organic light-emitting layer.

The first electrode is a transparent electrode. The second electrode is a reflective electrode.

The disclosure further provides a method for manufacturing an OLED backplane, comprising the following steps:

Step S1: providing a base substrate, and forming a buffer layer on the base substrate.

Step S2: depositing a first oxide semiconductor layer on the buffer layer, and introducing an argon gas and an oxygen gas with a flow ratio of the argon gas to the oxygen gas being a first ratio during the deposition.

Step S3: depositing a second oxide semiconductor layer on the first oxide semiconductor layer, and introducing the argon gas and the oxygen gas with a flow ratio of the argon gas to the oxygen gas being a second ratio during the deposition.

Step S4: depositing a third oxide semiconductor layer on the second oxide semiconductor layer, and introducing the argon gas and the oxygen gas with a flow ratio of the argon gas to the oxygen gas being a third ratio during the deposition such that an active layer comprising the first oxide semiconductor layer, the second oxide semiconductor layer, and the third oxide semiconductor layer is obtained.

Step S5: forming, over the active layer, a gate insulating layer and a gate electrode on the gate insulating layer.

Step S6: covering the active layer, the gate electrode and the gate insulating layer with an interlayer insulating layer thereon.

Step S7: forming a source electrode and a drain electrode on the interlayer insulating layer:

The first ratio and the third ratio are both greater than the second ratio.

Wherein the first ratio and the third ratio are both in a range from 2:1 to 4:1. The second ratio is in a range from 10:1 to 20:1.

Wherein the thickness of the first oxide semiconductor layer and the third oxide semiconductor layer is in a range from 50 Å to 100 Å. The thickness of the second oxide semiconductor layer is in a range from 200 Å to 800 Å.

Wherein the first oxide semiconductor layer, the second oxide semiconductor layer and the third oxide semiconductor layer are both an IGZO material. The buffer layer and the gate insulating layer are both one of or a combination of silicon oxide and silicon nitride.

Wherein the step S1 further comprises: forming a light shielding layer between the base substrate and the buffer layer. The light shielding layer shields the active layer:

Wherein the step S5 specifically comprises:

depositing a gate insulating film on the active layer and the buffer layer, and depositing a gate metal film on the gate insulating film;

patterning the gate metal film by a mask process to form the gate electrode;

etching the gate insulating film with the gate electrode as a mask to form the gate insulating layer.

The beneficial effects of the disclosure are as follows:

A method for manufacturing an OLED backplane is provided. The method comprises sequentially depositing a first oxide semiconductor layer, a second oxide semiconductor layer and a third oxide semiconductor layer to obtain an active layer of a thin film transistor. The flow ratio of an argon gas and an oxygen gas introduced during the deposition of the first oxide semiconductor layer and the third oxide semiconductor layer is greater than the flow ratio of the argon gas and the oxygen gas introduced during the deposition of the second oxide semiconductor layer. As a result, the oxygen content of the first oxide semiconductor layer and the third oxide semiconductor layer is greater than the oxygen content of the second oxide semiconductor layer. Therefore, the conductivity of the active layer of the thin film transistor device is enhanced. The interface defects are reduced. The stability of the thin film transistor device is improved.

BRIEF DESCRIPTION OF THE DRAWINGS

In order to further understand the features and technical contents of the disclosure, the detailed descriptions and the accompanying drawings of the disclosure are provided as follows. However, the drawings are only for reference and illustration, and are not intended to limit the disclosure.

In the drawings.

DETAILED DESCRIPTION OF PREFERRED EMBODIMENTS

In order to further illustrate the technical means and their effects of the disclosure, the preferred embodiments of the disclosure will be described in detail with reference to accompanying drawings as follows.

Figure 1:
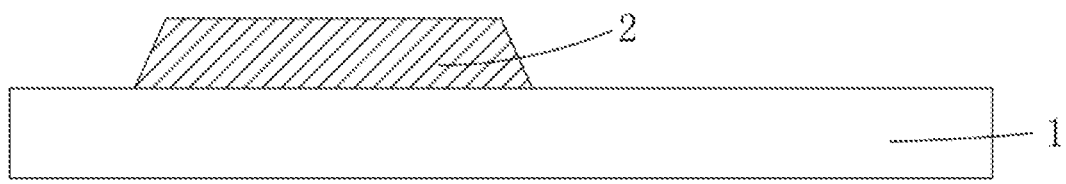
FIG. 1 and FIG. 2 are schematic views of a step S1 of a method for manufacturing an OLED backplane according to the disclosure.
Figure 2:
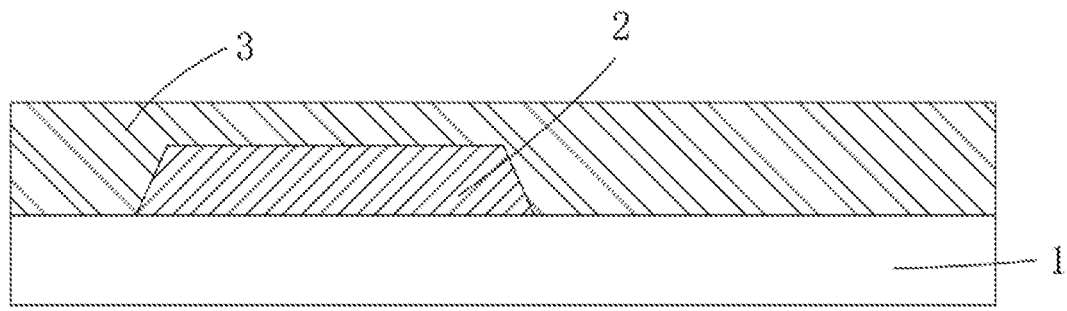
Figure 13:
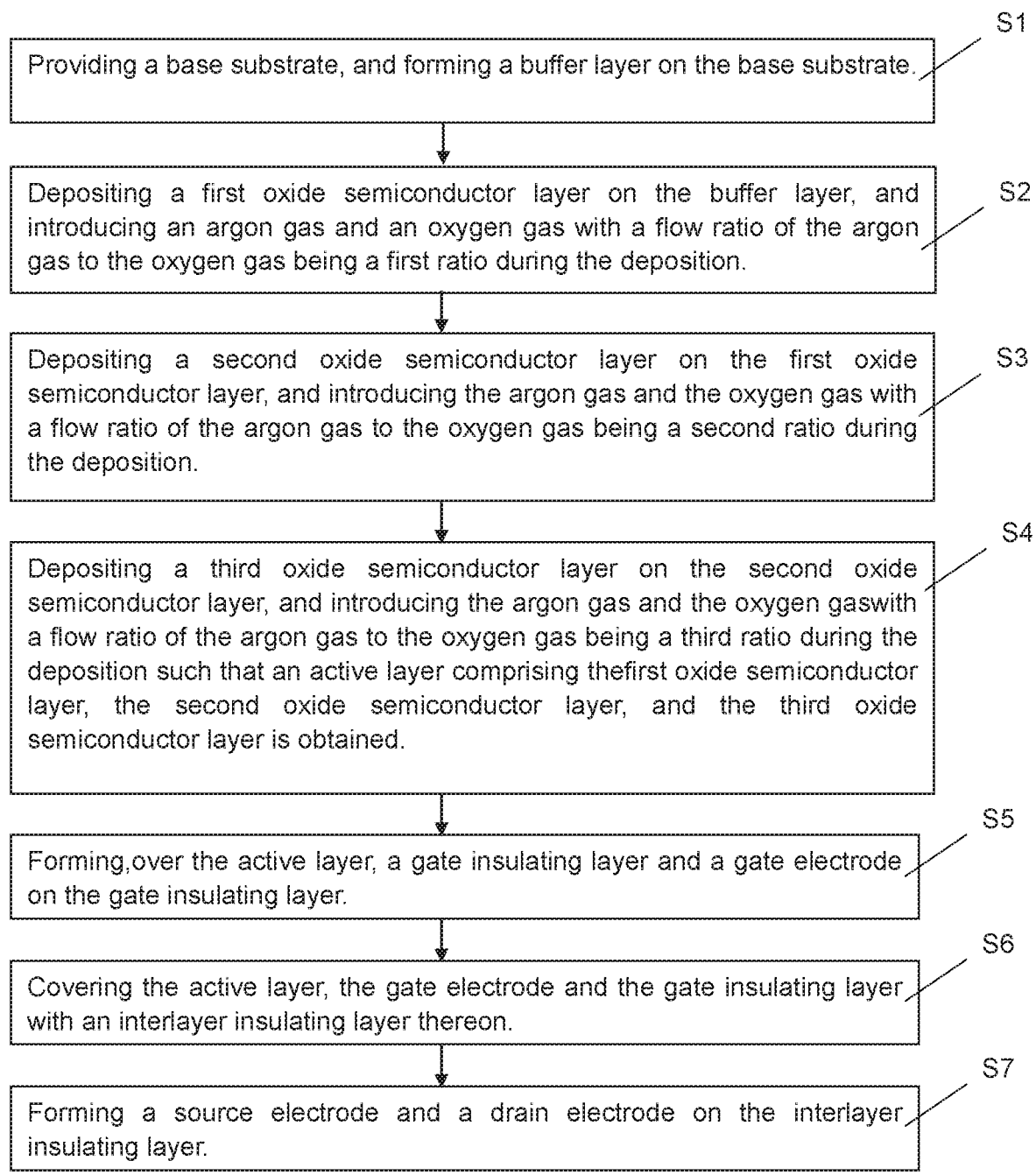
FIG. 13 is a flowchart of a method for manufacturing an OLED backplane according to the disclosure.

Referring to FIG. 13, the disclosure provides a method for manufacturing an OLED backplane, comprising the following steps:

Step S1: referring to FIG. 1 and FIG. 2, a base substrate 1 is provided. A buffer layer 3 is formed on the base substrate 1.

In specific implementation, as shown in FIG. 1, the step S1 may further comprise: depositing a light-shielding metal film on the base substrate 1 and patterning the light-shielding metal film to obtain a light shielding layer 2. The light shielding layer 2 corresponds to a region where an active layer 4 will be formed. The buffer layer 3 covers the light shielding layer 2 and the base substrate 1. The light shielding layer 2 is used for shielding the subsequently formed active layer 4 to prevent changes in the device performance, which would be induced by the active layer 4 being irradiated by light.

Preferably, the material of the buffer layer 3 is one of or a combination of silicon oxide (SiOx) and silicon nitride (SiNx). The thickness of the buffer layer 3 is in a range from 5000 Å to 10000 Å.

Figure 3:
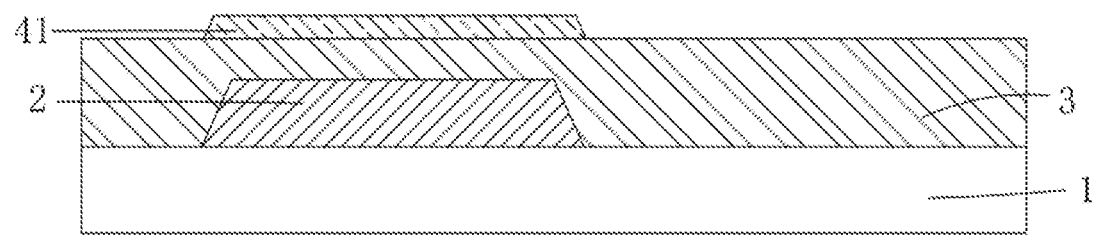
FIG. 3 is a schematic view of a step S2 of a method for manufacturing an OLED backplane according to the disclosure.

Step S2: referring to FIG. 3, a first oxide semiconductor layer 41 is deposited on the buffer layer 3. During the deposition, an argon gas and an oxygen gas are introduced with a flow ratio of the argon gas to the oxygen gas being a first ratio.

Specifically, the thickness of the first oxide semiconductor layer 41 is in a range from 50 Å to 100 Å.

Figure 4:
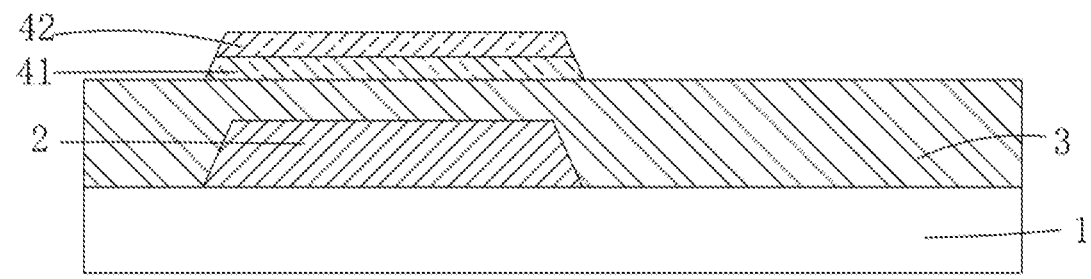
FIG. 4 is a schematic view of a step S3 of a method for manufacturing an OLED backplane according to the disclosure.

Step S3: referring to FIG. 4, a second oxide semiconductor layer 42 is deposited on the first oxide semiconductor layer 41. During the deposition, an argon gas and an oxygen gas are introduced with a flow ratio of the argon gas to the oxygen gas being a second ratio.

Specifically, the thickness of the second oxide semiconductor layer 42 is in a range from 200 Å to 800 Å.

Figure 5:
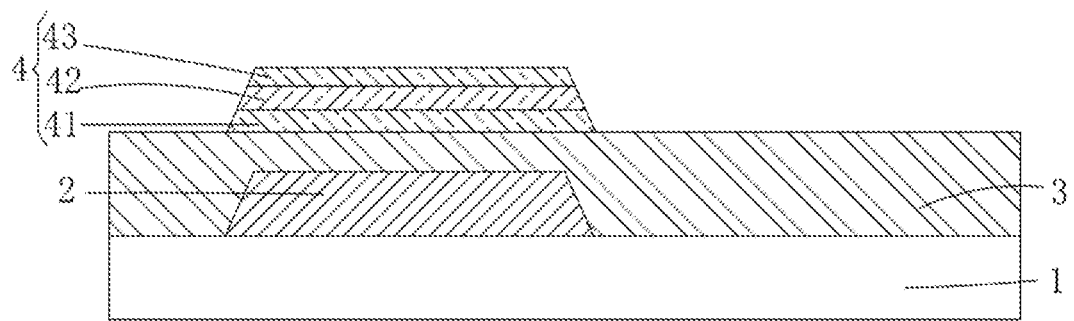
FIG. 5 is a schematic view of a step S4 of a method for manufacturing an OLED backplane according to the disclosure.

Step S4: referring to FIG. 5, a third oxide semiconductor layer 43 is deposited on the second oxide semiconductor layer 42. During the deposition, an argon gas and an oxygen gas are introduced with a flow ratio of the argon gas to the oxygen gas being a third ratio. As a result, an active layer 4 including the first oxide semiconductor layer 41, the second oxide semiconductor layer 42, and the third oxide semiconductor layer 43 is obtained.

Specifically, the thickness of the third oxide semiconductor layer 43 is in a range from 50 Å to 100 Å.

The first ratio and the third ratio are both greater than the second ratio. Preferably, the first ratio and the third ratio are both in a range from 2:1 to 4:1. The second ratio is in a range from 10:1 to 20:1. More preferably, the first ratio and the third ratio are both 4:1. The second ratio is 20:1.

Preferably, the material of all the first oxide semiconductor layer 41, the second oxide semiconductor layer 42 and the third oxide semiconductor layer 43 is indium gallium zinc oxide (IGZO).

Figure 6:
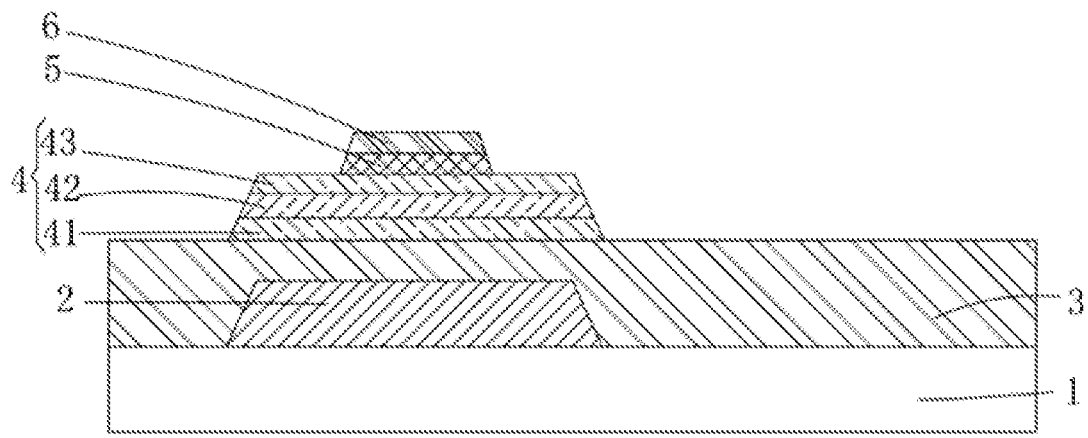
FIG. 6 is a schematic view of a step S5 of a method for manufacturing an OLED backplane according to the disclosure.

Step S5: referring to FIG. 6, a gate insulating layer 5 and a gate electrode 6 on the gate insulating layer 5 are formed on the active layer 4.

Specifically, the step S5 comprises: depositing a gate insulating film on the active layer 4 and the buffer layer 3, and depositing a gate metal film on the gate insulating film; patterning the gate metal film by a mask process to form the gate electrode 6; and etching the gate insulating film with the gate electrode 6 as a mask to form the gate insulating layer 5.

Furthermore, in the step S5, the gate electrode 6 and the gate insulating layer 5 cover the center of the active layer 4, and expose two ends of the active layer 4.

Preferably, the material of the gate insulating layer 5 is one of or a combination of silicon oxide and silicon nitride. The material of the gate electrode 6 is one of or a combination including several of molybdenum, aluminum, copper, and titanium. The thickness of the gate insulating layer 5 is in a range from 1000 Å to 3000 Å. The thickness of the gate electrode 6 is in a range from 2000 Å to 8000 Å.

Figure 7:
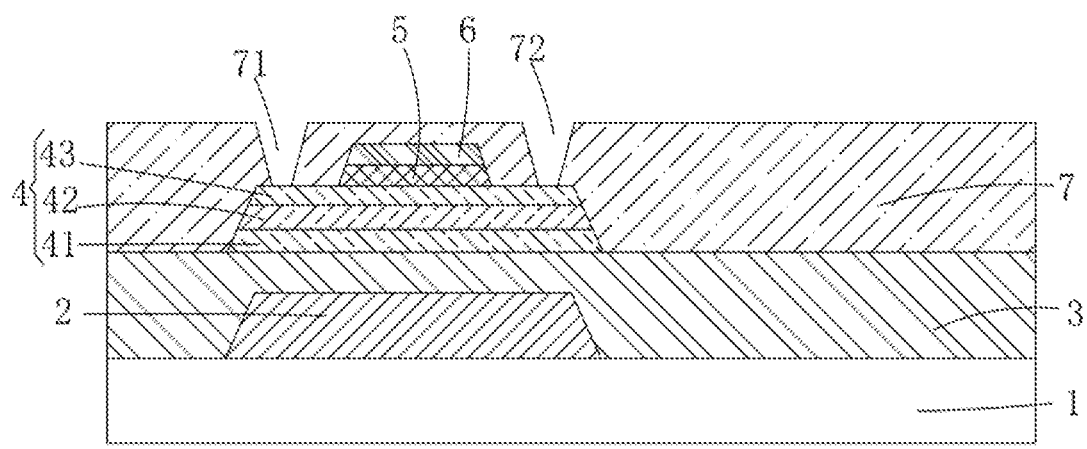
FIG. 7 is a schematic view of a step S6 of a method for manufacturing an OLED backplane according to the disclosure.

Step S6: referring to FIG. 7, the active layer 4, the gate electrode 6, and the gate insulating layer 5 are covered with an interlayer insulating layer 7 thereon.

Specifically, between the step S5 and the step S6, the method further comprises the following steps: performing a plasma treatment on the active layer 4 such that the resistance of the two ends of the active layer 4 is reduced to form an N+ conductor layer. The center of the active layer 4 is shielded by the gate insulating layer 5 and the gate electrode 6, and still retains semiconductor characteristics as a channel region of a thin film transistor device.

Furthermore, the step S6 further comprises: patterning the interlayer insulating layer 7 to form a first via hole 71 and a second via hole 72 exposing the two ends of the active layer 4.

Preferably, the thickness of the interlayer insulating layer 7 is in a range from 2000 Å to 10000 Å.

Figure 8:
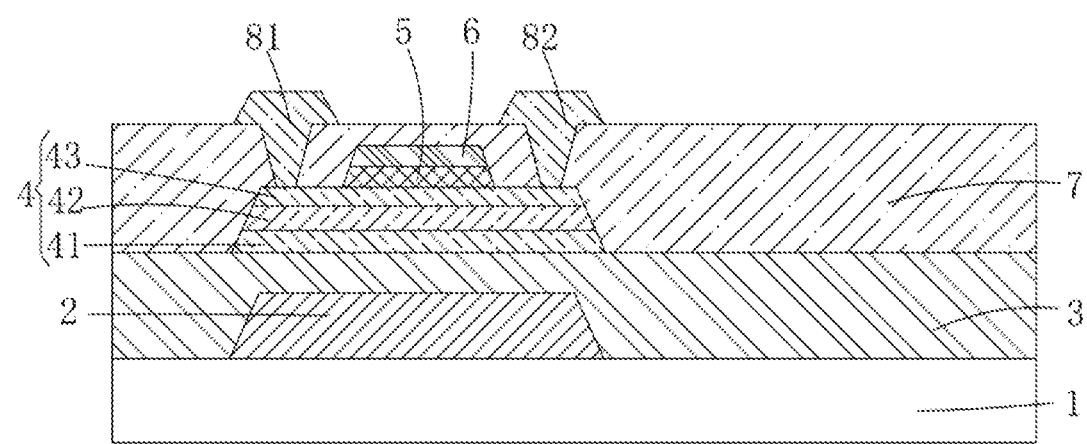
FIG. 8 is a schematic view of a step S1 of a method for manufacturing an OLED backplane according to the disclosure.

Step S7: referring to FIG. 8, a source electrode 81 and a drain electrode 82 are formed on the interlayer insulating layer 7.

Specifically, in the step S7, the source electrode 81 and the drain electrode 82 are respectively in contact with the two ends of the active layer 4 through the first via hole 71 and the second via hole 72.

The step S7 specifically comprises: depositing a source-drain metal film first, and then patterning the source-drain metal film by a mask process to form the source electrode 81 and the drain electrode 82.

Preferably, the material of the source electrode 81 and the drain electrode 82 is one of or a combination including several of molybdenum, aluminum, copper and titanium. The thickness of each of the source electrode 81 and the drain electrode 82 is in a range from 2000 Å to 8000 Å.

Figure 9:
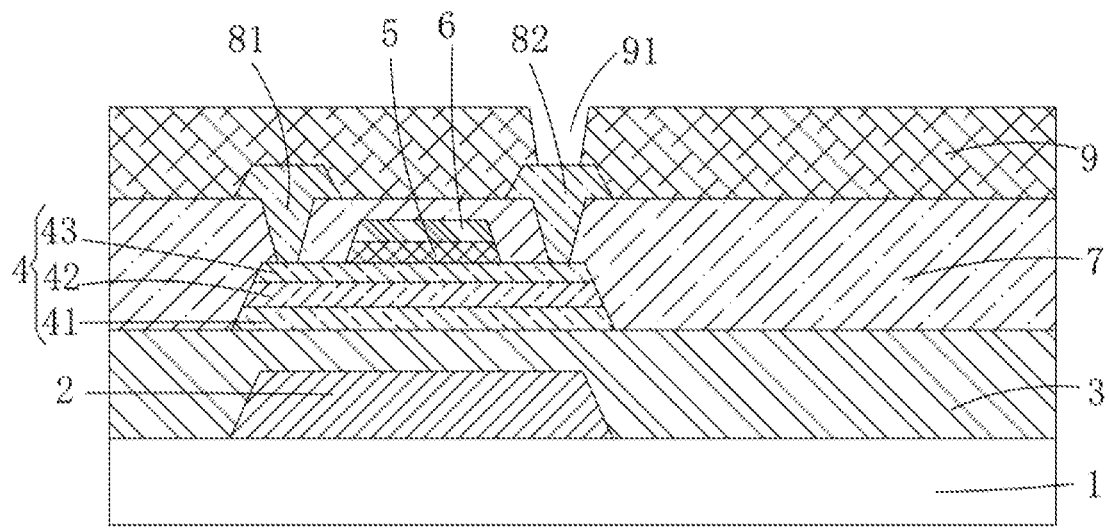
FIG. 9 is a schematic view of a step S8 of a method for manufacturing an OLED backplane according to the disclosure.

Step S8: referring to FIG. 9, a passivation layer 9 is deposited on the interlayer insulating layer 7, the source electrode 81 and the drain electrode 82. The passivation layer 9 is then patterned to form a third via hole 91 exposing the drain electrode 82.

Preferably, the material of the passivation layer 9 is one of or a combination including several of silicon oxide and silicon nitride. The thickness of the passivation layer 9 is in a range from 1000 Å to 5000 Å.

Figure 10:
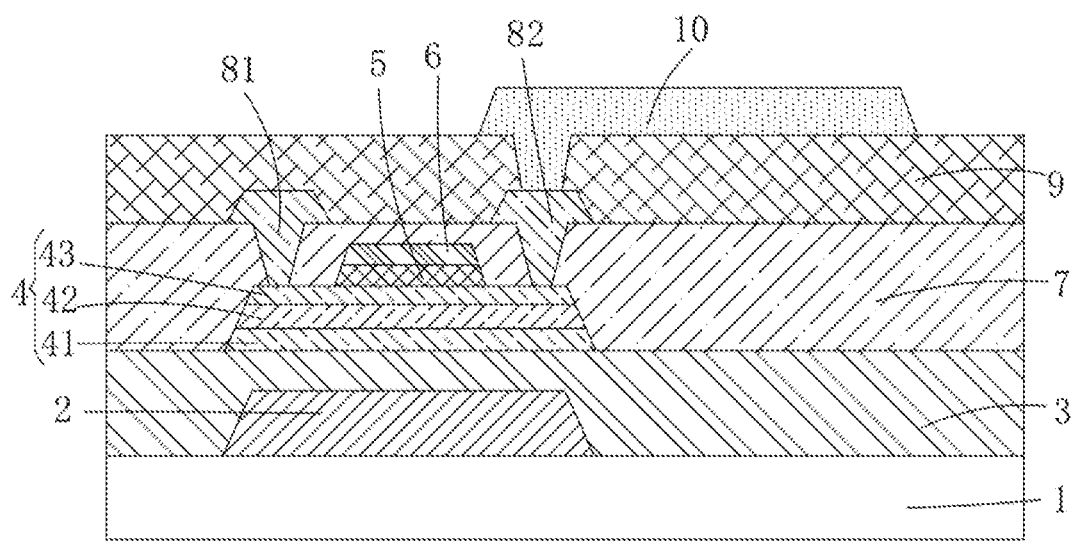
FIG. 10 is a schematic view of a step S9 of a method for manufacturing an OLED backplane according to the disclosure.

Step S9: referring to FIG. 10, a first electrode 10 is formed on the passivation layer 9. The first electrode 10 is in contact with the drain electrode 82 through the third via hole 91.

Preferably, the first electrode 10 is a transparent electrode. A preferred material is indium tin oxide (ITO). The first electrode 10 is an anode of an organic light-emitting diode.

Figure 11:
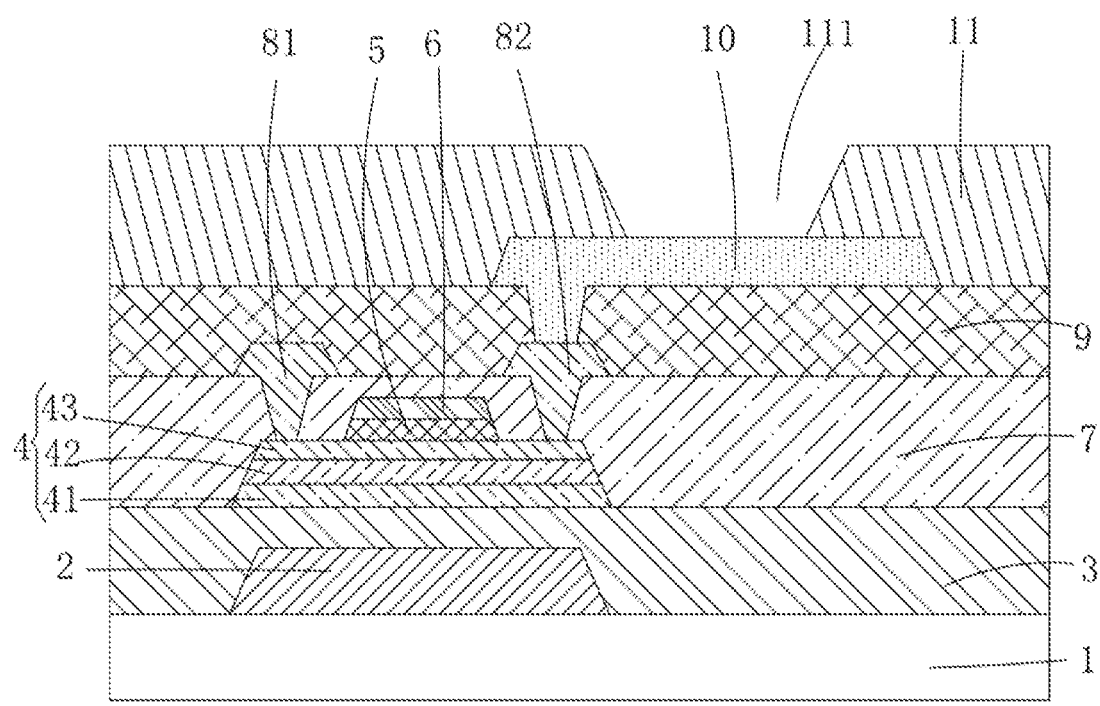
FIG. 11 is a schematic view of a step S10 of a method for manufacturing an OLED backplane according to the disclosure.

Step S10: referring to FIG. 11, a pixel defining layer 11 is formed on the first electrode 10 and the passivation layer 9. The pixel defining layer 11 is patterned to form a pixel defining recess 111 exposing the first electrode 10.

Figure 12:
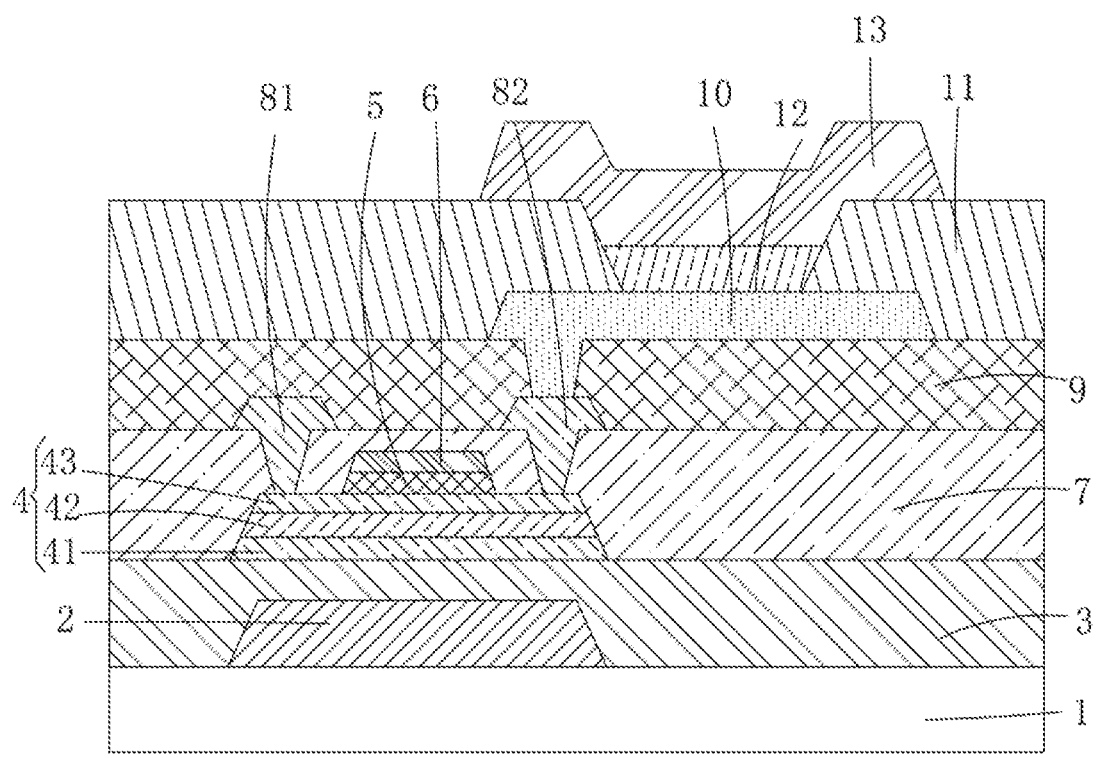
FIG. 12 is a schematic view of a step S11 of a method for manufacturing an OLED backplane according to the disclosure.

Step S11: referring to FIG. 12, an organic light-emitting layer 12 is formed in the pixel defining recess 111. A second electrode 13 is formed on the pixel defining layer 11 and the organic light-emitting layer 12.

Specifically, the organic light-emitting layer 12 may include a hole transport functional layer, a light-emitting functional layer and an electron transport functional layer which are sequentially stacked from the bottom to the top. Preferably, the second electrode 13 is a reflective electrode. The second electrode 13 is a cathode of an organic light-emitting diode.

It should be noted that both the first ratio and the third ratio is set to be greater than the second ratio. In other words, the amount of oxygen introduced during the deposition of the second oxide semiconductor layer 42 is set to be greater than the amount of oxygen introduced during the deposition of the first oxide semiconductor layer 41 and the third oxide semiconductor layer 43. As a result, the oxygen content of the second oxide semiconductor layer 42 located at the middle of the active layer 4 is larger than the oxygen content of the first oxide semiconductor layer 41 contacting the buffer layer 3 and the oxygen content of the third oxide semiconductor layer 43 contacting the gate insulating layer 5. That is, the oxygen content at the middle of the active layer 4 is high while the oxygen content at both the upper and lower sides is low. The second oxide semiconductor layer 42 has a high oxygen content and more oxygen vacancies. As a result, the conductivity of the active layer 4 is increased. Therefore, the electron mobility of the thin film transistor device is enhanced. On the other hand, the first oxide semiconductor layer 41 and the third oxide semiconductor layer 43 have a low oxygen content. As a result, the defects at the contact interface between the active layer 4 and the buffer layer 3 and the contact interface between the active layer 4 and the gate insulating layer 5 can be reduced. Therefore, the stability of the thin film transistor device is enhanced.

In summary, the disclosure provides a method for manufacturing an OLED backplane. The method comprises sequentially depositing a first oxide semiconductor layer, a second oxide semiconductor layer and a third oxide semiconductor layer to obtain an active layer of a thin film transistor. The flow ratio of an argon gas and an oxygen gas introduced during the deposition of the first oxide semiconductor layer and the third oxide semiconductor layer is greater than the flow ratio of the argon gas and the oxygen gas introduced during the deposition of the second oxide semiconductor layer. As a result, the oxygen content of the first oxide semiconductor layer and the third oxide semiconductor layer is greater than the oxygen content of the second oxide semiconductor layer. Therefore, the conductivity of the active layer of the thin film transistor device is enhanced. The interface defects are reduced. The stability of the thin film transistor device is improved.

In the foregoing, other corresponding modifications and variations may be made by those skilled in the art according to the technical solutions and technical ideas of the disclosure. An such modifications and variations should be included in the protection scope of the disclosure.

What is claimed is:

1. A method for manufacturing an organic light-emitting diode (OLED) backplane, comprising:
   a step S1, comprising providing a base substrate, and forming a buffer layer on the base substrate;
   a step S2, comprising depositing a first oxide semiconductor layer on the buffer layer, and introducing an argon gas and an oxygen gas with a flow ratio of the argon gas to the oxygen gas being a first ratio during the deposition of the first oxide semiconductor layer;
   a step S3, comprising depositing a second oxide semiconductor layer on the first oxide semiconductor layer, and introducing the argon gas and the oxygen gas with a flow ratio of the argon gas to the oxygen gas being a second ratio during the deposition of the second oxide semiconductor layer;
   a step S4, comprising depositing a third oxide semiconductor layer on the second oxide semiconductor layer, and introducing the argon gas and the oxygen gas with a flow ratio of the argon gas to the oxygen gas being a third ratio during the deposition of the third oxide semiconductor layer such that an active layer comprising the first oxide semiconductor layer, the second oxide semiconductor layer, and the third oxide semiconductor layer is obtained;
   a step S5, comprising forming, over the active layer, a gate insulating layer and a gate electrode on the gate insulating layer;
   a step S6, comprising covering the active layer, the gate electrode and the gate insulating layer with an interlayer insulating layer thereon; and
   a step S7, comprising forming a source electrode and a drain electrode on the interlayer insulating layer,
   wherein the first ratio and the third ratio are both greater than the second ratio, and the first ratio and the third ratio are both 4:1, and the second ratio is 20:1.

2. The method for manufacturing an OLED backplane as claimed in claim 1, wherein a thickness of the first oxide semiconductor layer and the third oxide semiconductor layer is in a range from 50 Å to 100 Å, and a thickness of the second oxide semiconductor layer is in a range from 200 Å to 800 Å.

3. The method for manufacturing an OLED backplane as claimed in claim 1, wherein the first oxide semiconductor layer, the second oxide semiconductor layer and the third oxide semiconductor layer are both an indium gallium zinc oxide (IGZO) material, and wherein the buffer layer and the gate insulating layer are both one of or a combination of silicon oxide and silicon nitride.

4. The method for manufacturing an OLED backplane as claimed in claim 1, wherein the step S1 further comprises:

forming a light shielding layer between the base substrate and the buffer layer, wherein the light shielding layer shields the active layer.

5. The method for manufacturing an OLED backplane as claimed in claim 1, wherein the step S5 specifically comprises:
depositing a gate insulating film on the active layer and the buffer layer, and depositing a gate metal film on the gate insulating film;
patterning the gate metal film by a mask process to form the gate electrode; and
etching the gate insulating film with the gate electrode as a mask to form the gate insulating layer.

6. The method for manufacturing an OLED backplane as claimed in claim 1, wherein in the step S5, the gate electrode and the gate insulating layer cover a center of the active layer and expose two ends of the active layer,
wherein between the step S5 and the step S6, the method further comprises:
performing a plasma treatment on the active layer such that a resistance of the two ends of the active layer is reduced to form an N+ conductor layer.

7. The method for manufacturing an OLED backplane as claimed in claim 1, wherein the step S6 further comprises:
patterning the interlayer insulating layer to form a first via hole and a second via hole respectively exposing the two ends of the active layer, wherein in the step S7, the source electrode and the drain electrode are respectively in contact with the two ends of the active layer through the first via hole and the second via hole.

8. The method for manufacturing an OLED backplane as claimed in claim 1, further comprising:
a step S8, comprising depositing a passivation layer on the interlayer insulating layer, the source electrode and the drain electrode, and patterning the passivation layer to form a third via hole exposing the drain electrode;
a step S9, comprising forming a first electrode on the passivation layer, wherein the first electrode is in contact with the drain electrode through the third via hole;
a step S10, comprising forming a pixel defining layer on the first electrode and the passivation layer, and patterning the pixel defining layer to form a pixel defining recess exposing the first electrode; and
a step S11, comprising forming an organic light-emitting layer in the pixel defining recess, and forming a second electrode on the pixel defining layer and the organic light-emitting layer.

9. The method for manufacturing an OLED backplane as claimed in claim 8, wherein the first electrode is a transparent electrode, and the second electrode is a reflective electrode.

10. A method for manufacturing an OLED backplane, comprising:
a step S1, comprising providing a base substrate, and forming a buffer layer on the base substrate;
a step S2, comprising depositing a first oxide semiconductor layer on the buffer layer, and introducing an argon gas and an oxygen gas with a flow ratio of the argon gas to the oxygen gas being a first ratio during the deposition of the first oxide semiconductor layer;
a step S3, comprising depositing a second oxide semiconductor layer on the first oxide semiconductor layer, and introducing the argon gas and the oxygen gas with a flow ratio of the argon gas to the oxygen gas being a second ratio during the deposition of the second oxide semiconductor layer;

a step S4, comprising depositing a third oxide semiconductor layer on the second oxide semiconductor layer, and introducing the argon gas and the oxygen gas with a flow ratio of the argon gas to the oxygen gas being a third ratio during the deposition of the third oxide semiconductor layer such that an active layer comprising the first oxide semiconductor layer, the second oxide semiconductor layer, and the third oxide semiconductor layer is obtained;
a step S5, comprising forming, over the active layer, a gate insulating layer and a gate electrode on the gate insulating layer;
a step S6, comprising covering the active layer, the gate electrode and the gate insulating layer with an interlayer insulating layer thereon; and
a step S7, comprising forming a source electrode and a drain electrode on the interlayer insulating layer,
wherein the first ratio and the third ratio are both greater than the second ratio,
wherein the first ratio and the third ratio are both 4:1, and the second ratio is 20:1,
wherein a thickness of the first oxide semiconductor layer and the third oxide semiconductor layer is in a range from 50 Å to 100 Å, and a thickness of the second oxide semiconductor layer is in a range from 200 Å to 800 Å,
wherein the first oxide semiconductor layer, the second oxide semiconductor layer and the third oxide semiconductor layer are both an IGZO material, and the buffer layer and the gate insulating layer are both one of or a combination of silicon oxide and silicon nitride,
wherein the step S1 further comprises:
forming a light shielding layer between the base substrate and the buffer layer, wherein the light shielding layer shields the active layer,
wherein the step S5 specifically comprises:
depositing a gate insulating film on the active layer and the buffer layer, and depositing a gate metal film on the gate insulating film;
patterning the gate metal film by a mask process to form the gate electrode; and
etching the gate insulating film with the gate electrode as a mask to form the gate insulating layer.

11. The method for manufacturing an OLED backplane as claimed in claim 10, wherein in the step S5, the gate electrode and the gate insulating layer cover a center of the active layer and expose two ends of the active layer,
Wherein between the step S5 and the step S6, the method further comprises:
performing a plasma treatment on the active layer such that a resistance of the two ends of the active layer is reduced to form an N+ conductor layer.

12. The method for manufacturing an OLED backplane as claimed in claim 10, wherein the step S6 further comprises:
patterning the interlayer insulating layer to form a first via hole and a second via hole respectively exposing the two ends of the active layer, wherein in the step S7, the source electrode and the drain electrode are respectively in contact with the two ends of the active layer through the first via hole and the second via hole.

13. The method for manufacturing an OLED backplane as claimed in claim 10, further comprising:
a step S8, comprising depositing a passivation layer on the interlayer insulating layer, the source electrode and the drain electrode, and patterning the passivation layer to form a third via hole exposing the drain electrode;

a step S9, comprising forming a first electrode on the passivation layer, wherein the first electrode is in contact with the drain electrode through the third via hole;

a step S10, comprising forming a pixel defining layer on the first electrode and the passivation layer, and patterning the pixel defining layer to form a pixel defining recess exposing the first electrode; and a step S11, comprising forming an organic light-emitting layer in the pixel defining recess, and forming a second electrode on the pixel defining layer and the organic light-emitting layer.

14. The method for manufacturing an OLED backplane as claimed in claim 13, wherein the first electrode is a transparent electrode, and the second electrode is a reflective electrode.

* * * * *